United States Patent [19]

Leyden et al.

[11] Patent Number: 4,889,585

[45] Date of Patent: Dec. 26, 1989

[54] METHOD FOR SELECTIVELY FORMING SMALL DIAMETER HOLES IN POLYIMIDE/KEVLAR SUBSTRATES

[75] Inventors: Richard N. Leyden, Topanga; Robert Lawrence, Malibu; William E. Elias, Redondo Beach, all of Calif.

[73] Assignee: Hughes Aircraft Company, Los Angeles, Calif.

[21] Appl. No.: 205,010

[22] Filed: May 31, 1988

Related U.S. Application Data

[63] Continuation of Ser. No. 923,251, Oct. 27, 1986, abandoned.

[51] Int. Cl.$^4$ .............................................. B44C 1/22
[52] U.S. Cl. ................................... 156/630; 156/644; 156/652; 156/656; 156/668; 252/79.2; 134/22.1; 134/34
[58] Field of Search ............... 156/652, 644, 630, 656, 156/668, 645; 252/79.2; 134/22.1, 34

[56] References Cited

U.S. PATENT DOCUMENTS

| | | | |
|---|---|---|---|
| 3,186,883 | 6/1965 | Frantzen | 156/644 |
| 3,235,426 | 2/1966 | Bruner | 156/668 |
| 3,275,486 | 9/1966 | Schroeder | 156/668 X |
| 3,331,718 | 7/1967 | Ruffing | 156/668 X |
| 3,616,294 | 10/1971 | Khelghatian | 156/668 X |
| 3,653,997 | 4/1972 | Rothschild et al. | 156/644 |
| 3,820,994 | 6/1974 | Lindberg et al. | 156/644 X |
| 3,890,636 | 6/1975 | Harada et al. | 357/68 |
| 4,298,424 | 11/1981 | Terada et al. | 156/668 |
| 4,639,290 | 1/1987 | Leyden et al. | 156/644 |

OTHER PUBLICATIONS

Lee and Neville, Handbook of Epoxy Resins, McGraw-Hill Book Company, 1967, pp. 22-8 to 22-65.
Markstein, "Low TCE Metals and Fibers . . . SMT Substrates", Electronic Packaging & Production, Jan. 1985, pp. 52-59.
Brooks, C. T., "Kevlar as the Reinforcing Fiber in Printed Wiring Broad Materials", p. 32.

*Primary Examiner*—David L. Lacey
*Assistant Examiner*—Thi Dang
*Attorney, Agent, or Firm*—M. E. Lachman; W. K. Denson-Low

[57] ABSTRACT

Methods for forming small diameter holes in polyimide/Kelvar ® substrates utilize hot concentrated sulfuric acid and then honing, as necessary, with liquid abradant slurries to smooth uneven edges of the openings.

7 Claims, No Drawings

METHOD FOR SELECTIVELY FORMING SMALL DIAMETER HOLES IN POLYIMIDE/KEVLAR SUBSTRATES

This application is a continuation of application Ser. No. 923,251 filed Oct. 27, 1986, now abandoned.

BACKGROUND OF THE INVENTION

1. Field of the Invention

This invention relates to a method for forming small diameter holes in polyimide/KEVLAR ® substrates using hot concentrated sulfuric acid to form these small diameter openings and then honing, as necessary, to smooth uneven edges of the openings.

2. Description of the Related Art

The use of solvents for forming small diameter openings in polyimide substrates is disclosed in U.S. patent application Ser. No. 806,874, filed Dec. 9, 1985, now U.S. Pat. No. 4,639,290, and entitled, "Methods for Selectively Removing Adhesives from Polyimide Substrates." While working well for their intended purpose, the methods disclosed there are, however, ineffective in forming small diameter openings in polyimide/KEVLAR ® substrates.

SUMMARY OF THE INVENTION

This invention relates to methods for forming small diameter openings in polyimide/KEVLAR ® substrates having metallic layers adhesively attached thereto. (KEVLAR ®, a trademark of E. I. Du Pont, is a polyamide material.) The term "polyimide/Kevlar substrate" is used herein in its known meaning in the art, to refer to a composite of Kevlar or other polyamide fibers or woven faric, and a polyimide polymer. Alternatively, this composite is referred to as a "polyimide/polyamide substrate. These methods comprise forming at least one opening of predetermined size in a polyimide/Kevlar substrate having a metallic layer thereon adhesively joined to the polyimide/KEVLAR ® substrate. The adhesive can be, and in preferred embodiments is a B-staged (partially cured) polyimide. These methods comprise forming at least one opening in the metallic layer to expose the underlying polyimide/KEVLAR ® substrate layer, and then contacting the exposed adhesive and polyimide/KEVLAR ® material in the openings with hot concentrated sulfuric acid for a time and at a temperature sufficient to form a hole, preferably a small diameter hole, through the substrate, but insufficient to undercut or infiltrate anywhere else on the substrate, and insufficient to damage substantially the substrate itself.

After this contacting step, these methods preferably comprise contacting the holes of predetermined size and shape in the polyimide/KEVLAR ® substrate with a liquid honing medium, as necessary, to smooth any rough edges of the holes. Liquid honing preferably comprises passing abradant slurries through the holes at speeds and at temperatures sufficient to remove material remaining in the holes and to smooth uneven edges at the periphery of the holes. Preferably, the liquid honing agent is micron-sized alumina in a water slurry, and is preferably directed through the holes at a measured pressure for a measured time.

This invention also relates to a method for forming at least one hole of predetermined size and shape in a polyimide/KEVLAR ® substrate comprising:

(a) forming at least one opening in said metallic layer, exposing polyimide/KEVLAR ® material below;

(b) contacting the polyimide/KEVLAR ® material exposed in said at least one opening with hot concentrated sulfuric acid with a temperature of at least about 185° C., and for a time sufficient to form an opening of predetermined size and shape in the polyimide/KEVLAR ® layer, and then removing the substrate from the acid and washing with water; and (c) contacting the substrate, as necessary, with a liquid honing medium to remove any polyimide/KEVLAR ® material remaining in the openings.

Alternatively, rather than having a metallic mask adhesively joined to the polyimide/Kevlar substrate, a mask of another material may be affixed to the substrate.

The medium used to form the holes in the polyimide/KEVLAR ® substrate is hot concentrated sulfuric acid. The temperature of the sulfuric acid should be at least 185° C., preferably at least 190° C.; its concentration, at least about 80%, preferably at least about 85%, more preferably, at least about 90%. The minimum temperature of the sulfuric acid should be sufficiently high to avoid decomposition of the sulfuric acid, and is, at room temperature and pressure, preferably at least about 165° C. The sulfuric acid concentration should be sufficiently high to prevent the acid from boiling below the treating temperature. The polyimide/KEVLAR ® substrate, after removal of the copper cladding therefrom, is exposed to the sulfuric acid for a period of time sufficient to form the openings, but no longer, to avoid undercutting and decomposition of the substrate. Preferably, these times are in the range of about 2 seconds to about 20 seconds for an 8 mil-thick adhesive/substrate. (Eight mils is equal to $2.0 \times 10^{-2}$ cm.)

The methods of this invention are effective in forming holes in copper-clad polyimide/KEVLAR ® substrates, such as circuit boards, particularly where the substrate has a thickness in the range of about 4 mils ($1.0 \times 10^{-2}$ cm.) to about 16 mils ($4.1 \times 10^{-2}$ cm.), the openings to be formed have diameters in the range of about 4 mils ($1.0 \times 10^{-2}$ cm.) to any larger size, and the minimum edge distance between openings is in the range of about 6 mils ($1.5 \times 10^{-2}$ cm.). With such substrates, the need to avoid infiltrating or undercutting the substrate beyond the peripheries of the openings of desired size, shape, and placement is essential.

These methods permit forming both so-called blind holes and so-called through holes in copper-clad or other metal-clad polyimide/KEVLAR ® substrates such as circuit boards comprising a substrate having a metallic layer adhesively bonded to either side thereof. A blind hole passes once through the metal cladding and the substrate, but does not pass again through the metal cladding on the side of the substrate directly opposite the opening formed in the metal cladding. A through hole passes entirely through the product, meaning that the hole passes through a first opening in the metal cladding on one side of the product, through the substrate beneath that opening, and through the metal layer in registration with (i.e., directly opposite to) the first opening in the cladding.

The methods of this invention permit forming both so-called blind holes and so-called through holes in copper-clad or other metal-clad polyimide/KEVLAR ® products. A blind hole passes once through the metal cladding, the adhesive layer, and the underlying polyimide/KEVLAR ® layer, but does not pass again through the metal cladding on the side of the product directly opposite the opening formed in the metal cladding. A through hole passes entirely through the product, meaning that the hole passes through a first opening in the metal cladding on one side of the product, through the adhesive layer beneath that opening, through the polyimide/KEVLAR ® layer beneath that opening, through the adhesive layer on the other side of the polyimide/KEVLAR ® layer, and through the metal layer in registration with (i.e., directly opposite to) the first opening in the cladding.

DESCRIPTION OF PREFERRED EMBODIMENTS

EXAMPLE 1

We formed an array, measuring one inch (2.54 cm.) by one inch, of holes having a diameter of about 0.01 inch ($2.54 \times 10^{-2}$) on 0.02 inch ($5.08 \times 10^{-2}$ cm.) centers in the 0.0015 inch ($3.8 \times 10^{-3}$ cm.) thick copper cladding on a flat polyimide/KEVLAR ® flat substrate having a thickness of 0.005 inch ($12.7 \times 10^{-3}$ cm.). The substrate carried cladding on both sides, and the holes in the copper cladding were formed in registration with one another to facilitate the formation of through holes in the copper-clad substrate by etching with ferric chloride on both sides of the substrate. After the formation of the openings in the copper cladding on both sides of the substrate, the copper cladding then functioned as a mask for the ensuing removal of the polyimide/KEVLAR ® substrate from the openings formed.

We then immersed the substrate with its pattern of holes of predetermined size, shape and spacing in a concentrated sulfuric acid bath for 10 seconds at 195° C. The concentration of sulfuric acid was 96%. After removing the substrate from the acid, we soaked the substrate in water for one minute to remove all sulfuric acid and to stop the reaction between the polyimide/KEVLAR ® substrate and the acid.

Thereafter, we cleaned the jagged edges in each of the holes with a liquid honing medium comprising aluminum oxide slurry. We maintained the nozzle of the hose dispensing a liquid honing medium at least nine inches from the holes at all times. We maintained the honing pressure in the range of about 10 to about 50 psi or about $0.68 \times 10^4$ to about $3.4 \times 10^4$ pascals.

Thereafter, the through holes were treated with electroless copper and plated to normal thickness. Microphotographs of the holes showed acceptable formation of through holes.

EXAMPLE 2

We formed an array measuring one inch (2.54 cm.) by one inch of holes having diameters of 0.004 inch ($1.02 \times 10^{-2}$ cm.) on 0.010 ($2.54 \times 10^{-2}$ cm.) inch centers on a flat polyimide/KEVLAR ® substrate measuring 0.005 inch ($1.27 \times 10^{-2}$ cm.) in thickness and carrying copper cladding measuring 0.0015 inch ($3.8 \times 10^{-3}$ cm.) on each side. After the etching of the copper cladding to facilitate formation of through holes, the copper cladding functioned as a mask for the ensuing treatment with sulfuric acid.

We immersed the substrate with its patterned array of openings in the copper cladding on each side in a concentrated (96%) sulfuric acid bath for seven seconds at 195° C. Immediately after removing the substrate from the acid bath, we soaked the substrate for one minute in water to remove all sulfuric acid.

We then cleaned the jagged material from the edges of each of the holes formed with a liquid honing medium comprising aluminum oxide grit dispersed in water. As in Example 1, we maintained the nozzle of the liquid honing dispenser at least nine inches from the holes at all times, and the honing pressure in the range of about 10 to about 50 psi.

The holes formed in this substrate were then treated with electroless copper and plated to normal thickness. Microphotographs of cross-sections of this substrate showed acceptably plated through holes.

COMPARATIVE EXAMPLE

When we tried to replicate the results of Example 1 with a sulfuric acid bath at 150° C, the sulfuric acid bath did not remove the polyimide/KEVLAR ® material from the holes formed in the copper cladding even after 100 seconds of immersion in the bath. Etching at 160° C. for two minutes and forty-five seconds destroyed the polyimide/KEVLAR ® substrate between the holes as well as in the holes, leaving only the copper cladding. Etching at 185° C., at an immersion time of 20 seconds, did not form through holes in the polyimide/KEVLAR ® substrate either. However, we were thereafter able to form such holes by subjecting the openings in the cladding to liquid honing without significant undercutting or infiltration of the polyimide/KEVLAR ® substrate between the holes.

What is claimed is:

1. A method for forming holes of predetermined size and shape in a polyimide/polyamide substrate having thereon at least one metallic layer adhesively joined thereto comprising:
    (a) forming at least one opening in said metallic layer, exposing polyimide/polyamide material below;
    (b) contacting the polyimide/polyamide material exposed in said at least one opening with hot concentrated sulfuric acid with a temperature of at least about 185° C., and for a time sufficient to form at least one hole of predetermined size and shape in the polyimide/polyamide layer, and then removing the substrate from the acid and washing with water; and
    (c) contacting the substrate with a liquid honing medium to smooth any rough edges of said at least one hole.

2. The method of claim 1 wherein said polyimide/polyamide substrate has first and second metallic layers joined thereto, wherein said first metallic layer is adhesively joined to a first side of said substrate and said second metallic layer is adhesively joined to a second side of said substrate opposing said first side.

3. The method of claim 2 wherein said at least one hole is a blind hole.

4. The method of claim 2 wherein said at least one hole is a through hole, and wherein said through hole is made by forming in each said metallic layer at least two openings in registration with one another on opposing sides of said substrate, and wherein the portion of said substrate between said two openings is removed.

5. A method for forming at least one hole of predetermined size and shape in a polyimide/polyamide substrate comprising:
    (a) affixing at least one mask to at least one side of said substrate, said mask having at least one opening therein of predetermined size and shape;

(b) immersing the masked substrate in hot concentrated sulfuric acid for a time and at a temperature sufficient to form at least one hole beneath said at least one opening, and then removing the masked substrate from the hot concentrated sulfuric acid;

(c) washing the substrate to remove substantially all sulfuric acid therefrom; and (d) contacting the substrate with a liquid honing medium to smooth any rough edges of said at least one hole.

6. The method of claim 5 wherein said temperature is at least about 185° C.

7. The method of claim 5 wherein said polyimide/polyamide substrate has first and second masks affixed thereto wherein said first mask is adhesively joined to a first side of said substrate and said second mask is adhesively joined to a second side of said substrate opposing said first side.

* * * * *